United States Patent [19]
Coudert et al.

[11] Patent Number: 5,434,794
[45] Date of Patent: Jul. 18, 1995

[54] METHOD FOR AUTOMATICALLY PRODUCING AN IMPLICIT REPRESENTATION OF THE PRIME IMPLICANTS OF A FUNCTION

[75] Inventors: Olivier Coudert, Bourg La Reine; Jean C. Madre, Boulogne, both of France

[73] Assignee: Bull S. A., Paris, France

[21] Appl. No.: 54,322

[22] Filed: Apr. 27, 1993

[30] Foreign Application Priority Data

Apr. 28, 1992 [FR] France .................. 92 05239

[51] Int. Cl.⁶ .............................. G06F 17/50
[52] U.S. Cl. .................. 364/489; 364/488
[58] Field of Search ............ 364/480, 489, 715.01, 364/784

[56] References Cited

U.S. PATENT DOCUMENTS

| | | | |
|---|---|---|---|
| 3,764,788 | 10/1973 | Hong et al. | |
| 4,495,626 | 1/1985 | Brunin et al. | 375/19 |
| 4,792,909 | 12/1988 | Serlet | 364/491 |
| 5,237,513 | 8/1993 | Kaplan | 364/490 |

FOREIGN PATENT DOCUMENTS 3156572 10/1991 Japan.

OTHER PUBLICATIONS

"Graph–Based Algorithms for Boolean Function Manipulation", IEEE Transactions on Computers, vol. C-35, No. 8, Aug. 1986, New York.

"Binary Decision Diagrams", IEEE Transactions on Computers, vol. C-27 No. 6, Jun. 1978, New York, pp. 509–516.

*Primary Examiner*—Vincent N. Trans
*Attorney, Agent, or Firm*—Weingarten, Schurgin, Gagnebin & Hayes

[57] ABSTRACT

The invention provides a method for automatically producing, in a memory zone of a data-processing device, an implicit representation of the prime implicants of a Boolean function, using that device. A Boolean function is represented, in another memory zone of that device, in the form of a binary decision diagram (f) of that function. The implicit representation is obtained from the decision diagram, by taking recursive paths across that diagram to find intermediate elements, which are then combined after each recursion. Each intermediate element uses occurrence variables ($O_1, \ldots ,O_n$) and sign variables ($S_1, \ldots ,S_n$). Means are used to obtain standardized intermediate elements during their creation, thus reducing memory consumption, and means of combining the intermediate elements after their standardization.

13 Claims, 6 Drawing Sheets

| | VAR | $IND_L$ | $IND_H$ | GEST |
|---|---|---|---|---|
| $Ad_1$ | $S_2$ | ∅ | 1 | Prime H |
| $Ad_2$ | $S_3$ | ∅ | 1 | Element Prime(L) |
| $Ad_3$ | $O_2$ | $Ad_2$ | $Ad_4$ | Element Prime(L) |
| $Ad_4$ | $S_2$ | 1 | ∅ | Element Prime(L) |
| $Ad_5$ | $S_2$ | ∅ | $Ad_2$ | Prime L^H |
| $Ad_6$ | $O_1$ | $Ad_5$ | $Ad_7$ | Prime(f).début |
| $Ad_7$ | $S_1$ | $Ad_3$ | $Ad_1$ | |
| $Ad_8$ | | | | |

| $Ad_n$ | VAR | $IND_L$ | $IND_H$ | GEST |
|---|---|---|---|---|
| $Ad_1$ | $x_1$ | "$Ad_2$" | "$Ad_3$" | |
| $Ad_2$ | $x_2$ | "Val 1" | "$Ad_4$" | |
| $Ad_3$ | $x_2$ | "Val 0" | "Val 1" | |
| $Ad_4$ | $x_3$ | "Val 0" | "Val 1" | |

$(L \wedge H)$ $(fig1)$ $Prime((L \wedge H)(fig1))$

|  | VAR | $IND_L$ | $IND_H$ | GEST |
|---|---|---|---|---|
| $Ad_1$ | $S_2$ | ∅ | 1 | Prime H |
| $Ad_2$ | $S_3$ | ∅ | 1 | Element Prime(L) |
| $Ad_3$ | $O_2$ | $Ad_2$ | $Ad_4$ | Element Prime(L) |
| $Ad_4$ | $S_2$ | 1 | ∅ | Element Prime(L) |
| $Ad_5$ | $S_2$ | ∅ | $Ad_2$ | Prime L^H |
| $Ad_6$ | $O_1$ | $Ad_5$ | $Ad_7$ | Prime(f).début |
| $Ad_7$ | $S_1$ | $Ad_3$ | $Ad_1$ |  |
| $Ad_8$ |  |  |  |  |

*FIG.10*

METHOD FOR AUTOMATICALLY PRODUCING AN IMPLICIT REPRESENTATION OF THE PRIME IMPLICANTS OF A FUNCTION

FIELD OF THE INVENTION

The invention concerns a method for automatically producing an implicit representation of the prime implicants of a Boolean function using a data-processing machine.

BACKGROUND OF THE INVENTION

There are applications in which Boolean functions are manipulated in many fields. As an example, the synthesis and optimization of complex electronic circuits and the analysis of system failures can be based on such manipulation. In the analysis of system failures, a Boolean function can be used to represent the occurrence of a failure as a function of the outside events that could cause that failure. Such a function can be represented in the form of a truth table, Boolean equations and a Karnaugh map. These various known modes of representation make it possible to display each combination of variables (or events) that may exist. However, these representations have the disadvantage that their size grows exponentially as a function of the number of variables appearing in the determination of the function. Thus, for a dependent function with n variables, there are $2^n$ possible combinations of those variables.

Consequently, if, for example, the function is represented in the form of a truth table, each possible combination of variables and each corresponding value of the function can be represented on the same line, so that for a function with n variables, such a table has $n+1$ columns and $2^n$ lines. It can be stored in the memory of a processor, but it takes up a lot of space. And to find the value of the function for a given combination of variables, it may be necessary to go through a certain number of lines in the table, which can have a negative effect on the processing time. Assume, for example, that the combination that you are looking for is the last one on the table; you would have to go through every line in the table to find the corresponding value of the function.

In order to correct the disadvantages of these representations, the idea has been advanced to represent Boolean functions in the form of binary decision graphs or diagrams, called B. D. D., the initials of their name "Binary Decision Diagram" in English.

Before explaining what a binary decision diagram is, some ideas and definitions of the functions and the terminology used should be given.

Assume a function f defined by the following formula: $f = x_1 x_2^* + x_1^* x_2 x_3$. We say that the formula is a propositional formula, and $x_1$, $x_2$, $x_3$ are propositional variables, corresponding to atomic events capable of causing the appearance of a reference event.

Thus, in the analysis of systems failures, the atomic events are the causes of the failure, and the reference event is a special failure linked to causes combined with one another in certain ways.

The terms "$x_1$", "$x_2$", "$x_3$" and "$x_1^*$", "$x_2^*$", "$x_3^*$", which appear in the formula, are literals corresponding to the propositional variables $x_1$, $x_2$, $x_3$. A literal represents how the propositional variable acts in the function, i.e., if the occurrence or non-occurrence of the associated event is decisive or indifferent. $x_1 x_2^*$ and $x_1^* x_2 x_3$ are literal products. A product is therefore a conjunction of variables and negations of variables.

The first product $x_1 x_2^*$ means that the presence or absence of the third variable $x_3$ is indifferent.

The formula means that the reference event occurs ($f=1$) when the first atomic event $x_1$ occurs ($x1=1$) and the second $x_2$ does not occur ($x_2=0$) simultaneously, or else when the first event $x_1$ does not occur simultaneously and the second and third $x_2$ and $x_3$ do.

A binary decision graph is composed of a certain number of labels connected to one another by branches. Each label represents a set variable of the function, which has two branches coming off of it. The unit consisting of the label, hence the variable, plus the two branches that come off it forms a node, sometimes called a vertex. Each branch can be either a terminal branch, which ends with a terminal leaf whose value is "0" or "1," or an intermediate branch which ends with the label of another node. One of the branches that comes off a label is called the low or negative branch and represents what happens when the value of the associated variable is "0" (using the conventions mentioned above), while the other branch, called the high or positive branch, shows what happens when the value of the variable is "1." In fact, the tree starts with a single-root variable (a label), called the root, off of which there are two branches, to which other nodes or leaves are connected in cascade.

By going from the root of the tree to the terminal leaf whose value is 1, a combination of literals is set up, for which the function is equal to 1, i.e., a combination (a product) of variables causing the appearance of the reference event shown is produced. Consequently, by taking each of these paths from the root to each of the terminal leaves whose value is 1, you can find each of the combinations of variables causing the appearance of the reference event.

Such a diagram or graph thus makes it possible to display all the combinations of variables of a function in an extremely complete, concise manner. The memory space occupied is less compared to the tables, and the processing time for the functions shown in binary decision graph form is much faster.

What is more, a binary decision graph lends itself specifically to automatic processing with a processor, since each node can be represented using information contained in one memory word of the processor.

Different approaches to the binary decision diagrams have been conceived. Thus, Randal E. Bryant, in a publication that appeared in "IEEE Transactions on Computers," Volume C-35, Number 8, August 1986, showed how the variables, and hence the nodes could be ordered to obtain extremely compact, but perfectly representative graphs of the different combinations of variables appearing in a function.

However, such graphs do not make it possible to carry out effectively or quickly all the manipulations possible on the functions represented in this way. Indeed, some types of analyses require calculation of the prime implicants of the function: for example, this is true when probability studies, occurrence of the root event or any other type of event analysis is performed.

It should be noted that an implicant of a function is a product that implies that function. Also, that an initial product P "contains" a second product P', if the relation P "implies" P' (this is written P=>P') is true. Additionally, a prime implicant is an implicant such that there is no other implicant that contains it.

Going through a binary decision diagram from its root to its terminal leaves does not make it possible to determine directly what the prime implicants of that function are.

Recent approaches have been devised to calculate implicitly the prime implicants of a function from the binary decision diagram which represents it.

Thus, in a publication in November 1991, made by the applicant, whose authors are the inventors mentioned in this application, several methods were presented which make it possible to determine, in an implicit way, the prime implicants of a function.

These methods consist of converting the binary decision diagram, using rules set up by the authors, and representing each literal associated with a propositional variable, such as $x_n$ appearing in a product, by a set of two other variables, a first variable called the occurrence variable $O_n$ and a second variable called a sign variable $S_n$.

The representation is simple: if the associated occurrence variable is zero, this means that the propositional variable is indifferent in obtaining the product; in this case, the value of the associated sign variable is indifferent; if the occurrence variable is positive or has the binary value "1," this means that the presence or absence of the associated propositional variable is significant for the result, and the associated sign variable indicates whether the corresponding propositional variable is present (by convention, the sign variable =1 in this case) or absent (by convention, the sign variable =0).

The rules developed in this publication take into account the fact that the same product of variables can have several representations and introduced the idea of "meta-product."

Indeed, for n=4, for example, the product $\{x_2 \cdot x_3^* \cdot x_4\}$ can be represented by the following unit of two sets of occurrence and sign variables [(0111),(1101)] and [(0111),(0101)] which give a canonical representation of the product.

Consequently, a set of different products can be represented by a prime set of reference pairs. By making a logic union of all the pairs in this set, one obtains a second set of pairs constituting the "meta-product," which is therefore the canonical representation of the set of products.

Thus, by making a diagram with set rules that looks like a binary decision diagram and uses occurrence and sign variables, the result is an implicit representation of the set of prime implicants: each path that starts from a root label and ends with a terminal leaf that has a logic value of "1" goes by positive branches associated with occurrence variables and their negative branches, and goes by positive branches associated with sign variables and their negative branches. Going down the negative branch of a given occurrence variable ($O_i$) on a path means that the corresponding propositional variable does not participate in the product constituting the prime implicant considered.

However, the rules given in this publication are not necessarily best suited for automatic use.

Indeed, calculating the prime implicants of a function represented in the form of a binary decision diagram with a root variable that has a low branch and a high branch coming off of it, which are themselves composed of low sub-branches and high sub-branches, requires calculating the prime implicants of the low branch, calculating the prime implicants of the high branch and calculating the prime implicants of the function representing the intersection of the low branch and the high branch. Then, the final calculation requires an assembly operation combining the prime implicants calculated in this way. This therefore assumes some recursive calculations in parallel, since to end up with the prime implicants of a main branch, it is necessary to have calculated and then combined the set of prime implicants of each of its sub-branches.

The assembly operations (union, intersection, complementation, etc. . . . ) necessary for these successive determinations are no problem to carry out if the different branches and sub-branches are mutually symmetrical in structure. If the ordering is not done correctly, these necessary combinations cannot be made.

Now, the need for symmetrically ordering the variables makes this method extremely memory-intensive and difficult to perform automatically. Sometimes, intermediate implicit representations are obtained which are substantial in size, to keep the symmetry, so that the memory of the machine can be saturated before the set of calculations is finished; and even if the memory is sufficient, the size of the final representation is very large, with either redundant information, or information unnecessary for determining the prime implicants.

To the extent that the memory of the machine was sufficient to establish the implicit representation of the prime implicants, it is still conceivable to simplify it in order to eliminate redundancies. This is difficult, even impossible to do in certain cases.

SUMMARY OF THE INVENTION

The purpose of the invention is to provide a method for implicit determination of the prime implicants of a function from its binary decision diagram, formed in the memory of a processor, that does not have the disadvantages of the prior art.

According to the invention, a method for automatically producing, with a data-processing machine, in a memory zone of that machine, an implicit representation (PRIME(f)) of the prime implicants of a Boolean function (f) initially represented, in another memory zone of that machine, in the form of information forming a binary decision diagram of that function, consists of producing the implicit representation from this information by taking recursive paths across this diagram to determine intermediate elements, which are then combined after each recursion, with each intermediate element using occurrence variables ($O_1, \ldots, O_n$) and sign variables ($S_1, \ldots, S_n$), corresponding respectively to each of the propositional variables ($x_1, \ldots, x_n$) of the decision diagram, is characterized by the fact that it uses means of obtaining standardized intermediate elements at the time that they are produced, thus reducing memory consumption, and means of combining the intermediate elements after they are standardized.

The standardization consists of testing, and/or comparing, the values of the parameters or elements occurring in the creation of the intermediate forms, and, depending on the results of the tests or comparisons, forming simplified intermediate forms before they are constructed. This procedure avoids encumbering the memory. Nonetheless, in certain cases, it entails a loss of symmetry between the intermediate forms, so that later constructions require the use of specific functions to combine these intermediate forms.

The invention is therefore particularly advantageous, since it makes it possible to build a structure that has the form of a binary decision diagram which, in fact, gives an implicit representation of the prime implicants containing only the elements necessary for determining those implicants, thus reducing memory consumption. The determination is performed by moving along different trajectories, starting with the root variable of the structure formed in this way and ending with a terminal leaf whose value is "1."

DESCRIPTION OF THE DRAWINGS

The invention will be more fully understood from the following detailed description, taken in conjunction with the accompanying drawings in which:

FIG. 10 illustrates the way in which the memory of a processor can be organized to contain information containing the diagram in FIG. 9.

DETAILED DESCRIPTION OF THE PREFERRED EMBODIMENTS

As has been mentioned, a propositional variable can be represented using a set of associated occurrence variables and sign variables.

The following will therefore consider a propositional variable $x_n$ that can be combined with an occurrence variable $O_n$ and a sign variable $s_n$.

Figures 1, 2:
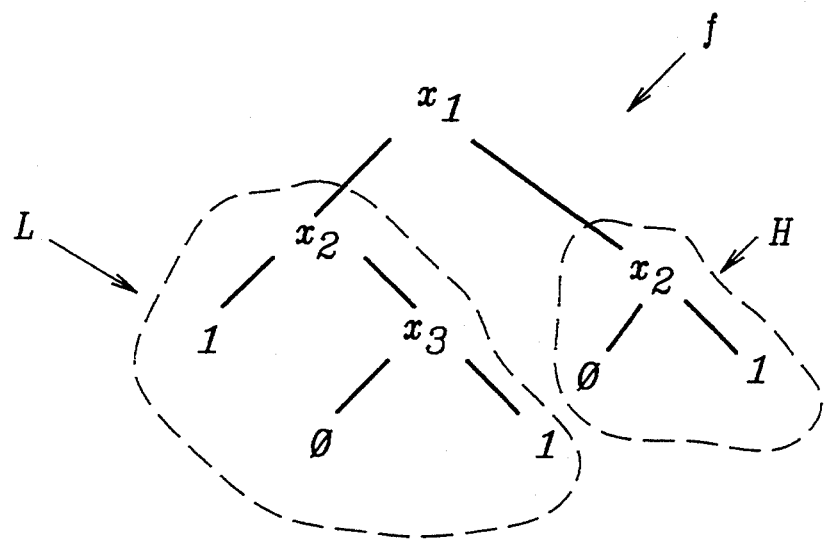
FIG. 1 shows schematically a binary decision diagram of a Boolean function (f)
FIG. 2 illustrates the way in which the memory of a processing device can be organized to contain information containing the diagram in FIG. 1.

FIG. 1 shows a binary decision diagram of a function in which three propositional variables $x_1$, $x_2$, $x_3$ appear.

In the example shown in FIG. 1, a first variable, identified by a label $x_1$ is the root of the graph. This variable has two branches coming off it, a first branch at the lower left and a second branch at the lower right. The left branch is called the low branch, while the right branch is called the high branch. The root unit with its low and high branches thus constitutes the first node of the diagram.

The low branch and the high branch each end with a second variable identified by the label $x_2$. This second branch is also associated with a low branch and a high branch, which forms another node.

The set of labels (or variables), branches and leaves associated with a low branch of another variable constitutes what will be called the low part, marked L, of that variable. The set associated with the high branch of a variable constitutes the high part, marked H, of that variable.

Thus, the high part of the variable $x_1$ starts with a node whose root is the variable $x_2$; the low part is the leaf 0, and the high part a leaf with a value of 1.

Moving through the branches of the tree from the root toward the leaves whose value is "1," it can be determined that the function represented is equal to 1 when:

$x_2$ is equal to 0 and simultaneously $x_1$ is equal to 0°, or $x_1$ is equal to 0, and simultaneously $x_2$ is equal to 1, while $x_3$ is equal to 1.

The preceding is deduced by moving through the low branches associated with the root $x_1$.

Moreover, from the high part associated with the root $x_1$, one can deduce that the function is also equal to 1 when simultaneously $x_1$ and $x_2$ are equal to 1.

As a result of the preceding, the function shown could be written:

$$f = x_1{}^*x_2{}^* + x_1{}^*x_2x_3 + x_1 x_2.$$

The construction of a binary decision diagram, as is shown in FIG. 1, follows set, known rules which are not the subject of this invention. They are described in the above-mentioned publication by Randal E. Bryant.

Note that there is a certain symmetry between the high and low parts associated with a variable, a symmetry that makes it possible to carry out logic operations between these high and low parts without difficulty. Note also that the implicit determination of the prime implicants of a function represented by such a binary decision diagram requires this type of operation.

FIG. 2 illustrates how the memory of a computer can be organized to contain information forming the binary decision diagram of the function represented in FIG. 1. This is not limiting in any way.

In a way that is known, the memory is organized into words, and each word is determined by its absolute or relative address ADn.

In order to represent a binary decision diagram, each word can be divided into at least 4 fields: a first field VAR, a second field $IND_L$, a third field $IND_H$ and a fourth field GEST.

The first field VAR of a word contains information indicating the type and the order of a propositional variable of the function, for example $x_n$.

The second field $IND_L$ indicates whether the low branch of the corresponding variable ends with a node or a leaf.

The third field $IND_H$ indicates whether the high part of the corresponding variable ends with a leaf or a node.

The fourth field GEST contains, for example, some management parameters necessary for operating the memory, when moving between the different addresses.

More precisely, the second and third fields can be supplemented in the following way: if the low branch associated with the propositional variable contained in the word ends with a leaf, then this second field contains information "Val 0" or "Val 1" on the value of that leaf, as shown in some cases in FIG. 2.

On the other hand, if the low branch associated with a propositional variable ends with a node, then this second field $IND_L$ contains the value of the memory address of the word where this node is written.

The third field $IND_H$ indicates, in the same way as the second field, whether the high branch associated with a variable ends with a node or a leaf and contains, if necessary, an address or a value.

The fourth field GEST contains management parameters indicating the paths that have already been taken or any other type of information necessary for the management and use of the memory.

Thus, starting with the word located at the address $Ad_1$, and moving through the whole memory, the processing system can reconstitute the products for which the function is equal to "1." It is therefore capable of reconstructing the tree and its different nodes.

However, note that either moving through the binary decision diagram or moving through the memory does not make it possible to find the prime implicants of the function. According to this invention, the binary decision diagram of a Boolean function can be used to produce a diagram that represents implicitly the prime implicants of the function.

For the sake of clarity, we will consider that the binary decision diagram uses variables $(x_1, \ldots, x_n,)$ and the diagram of its prime implicants uses corresponding occurrence variables $(O_1, \ldots, O_n)$ and sign variables $(S_1, \ldots, S_n)$.

Assume also that the variables are ordered in the following way:

$$x_1 < x_2 < \ldots < x_n \text{ and } O_1 < S_1 < O_2 < S_2 < \ldots < O_n < S_n$$

The conversion used to find the diagram for implicit representation of the prime implicants leads to the construction of the nodes.

By convention, in the rest of the description, a formula of the type $y = Nd(x,L,H)$ signifies that the processing system constructs in its memory the node identified by the variable $y$, a node whose label is the variable $x$, whose left branch, i.e., low branch is L and whose right branch, i.e., high branch, is H.

Also by convention, a formula of the type $Nd(x,L,H) = y$ breaks down the node y into its root, i.e., the variable x, its left branch L and its right branch H.

The processing system performs the following operations when a node is created.

First of all, it tests, when the node y is made, whether the low branch L is equal to the high branch H. If it is, instead of constructing the node whose root would be x and whose low and high branches would be L and H respectively, it simply returns one of these branches consisting of L (or H). It can, of course, be a terminal leaf (when $L = H = 0$ or 1) or a node or a set of nodes.

If L is different from H, the system verifies in the memory whether the node being constructed already exists there. If it does, it returns this node directly, plotting its address in memory.

If the node does not exist in the memory, then it is constructed there, at an address left free, in the way indicated above.

This way of acting, which consists of not reconstructing in the memory a node that already exists there, saves memory and time during later operations.

The function that makes it possible to construct the implicit representation of the prime implicants from the binary decision diagram, i.e., a structure having variables $x_1, \ldots, x_n$, of a Boolean function (f) is called PRIME(f). This function PRIME(f) makes it possible to obtain a representation composed exclusively of occurrence variables $O_1, \ldots, O_n$ and sign variables $S_1, \ldots, S_n$.

First of all, a test is performed to determine the type of function. If $f = 0$, then PRIME(f) = 0, if $f = 1$ then PRIME(f) = 1. If not, (f is different from 0 or 1), this means that f is present in the form of a node having a root $X_k$, a low branch L and a high branch H. Thus, by using the conventions defined above, one can write that $Nd(x_k, L, H) = f$.

In this case, the function PRIME, which, it will be noted further on, is recursive, calls upon a NORME function which standardizes a node $Nd(O_k, P, P')$, whose root would be the occurrence variable $O_k$ associated with the root variable $x_k$ of the corresponding binary decision diagram, whose low branch is an implicit representation P constructed during a preceding recursion, and whose high branch is another implicit representation P' constructed using elements obtained during a preceding recursion, as will be explained below. Thus, we can write:

$$\text{PRIME (f)} = \text{NORME} (O_k, P, P').$$

In one preferred embodiment, the function NORME($O_k$,P,P') in which $O_k$ is a variable and P and P' are implicit representations, starts with successive tests on the values of P and P', which, it will be recalled, are obtained during preceding recursions.

If $P = P'$ or $P' = 0$, then the final result is NORME($O_k$,P,P') = P. If $P = 0$, the function NORME makes it possible to render the result:

$$\text{NORME}(O_k, P, P') = P'.$$

If none of the preceding conditions on P and P' is verified, the result is a node defined in the following way:

$$\text{NORME}(O_k, P, P') = Nd(O_k, P, P').$$

The standardized node is therefore constructed in memory only after the relative values of P and P' have been determined, which is particularly economical in terms of memory consumption and fast in terms of processing.

Figure 3:
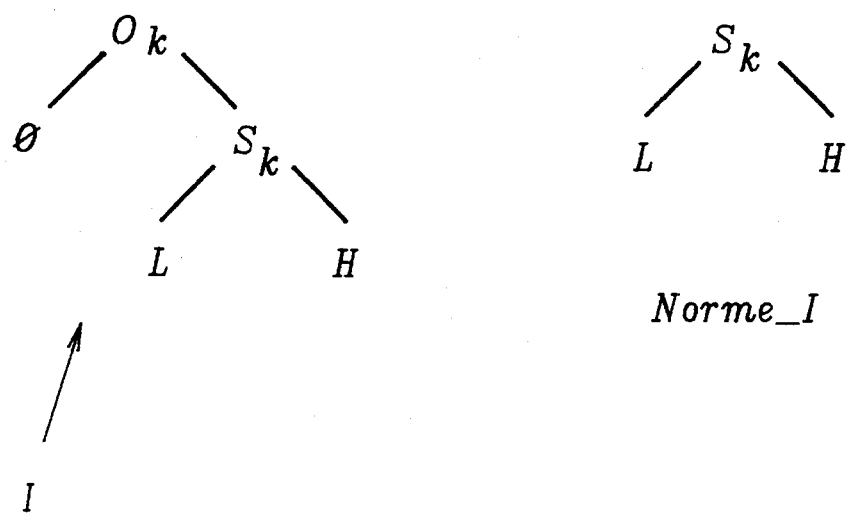
FIG. 3 illustrates the standardization function of an intermediate element.

FIG. 3 illustrates how the NORME function works. The left part of the figure shows a node that could be obtained if this function was not used. For example, the root would be an occurrence variable $O_k$, connected by its low branch to a terminal leaf with a value of 0, and by its high branch to a node whose root is $S_k$, whose low branch is L and whose high branch is H. The function NORME, called by the prime function applied to this diagram, makes it possible to obtain definitively a node, shown in the right part of FIG. 3, whose root is the sign variable $S_k$ and which has a low branch L and a high branch H, with no representation of the left part constructed in the memory.

The same would be true if instead of the low branch of the left part, connected to a leaf with a value of "0", there were a node $v = Nd(S_k, L, H)$ identical to that of the high branch.

In a first variation, a single test on the values of P and P' is performed. If the result of this test is negative, then the NORME function gives the following result:

$$\text{NORME } (O_k, P, P') = Nd(O_k, P, P').$$

Thus, in an initial embodiment of this variation, the test is performed to find out whether $P = P'$: if yes, the result given is NORME($O_k$,P,P') = P°; if not NORME(O,P,P') = Nd($O_k$,P,P')

In a second embodiment of this variation, the test is performed to find out if $P' = 0$: if the answer is yes, the result is NORME($O_k$,P,P') = P°, if not, NORME($O_k$,P,P') = Nd($O_k$,P,P').

In a third embodiment of this variation, the test is performed to find out if $P = 0$: if it does, the result is NORME($O_k$,P,P') = P'; if not, NORME($O_k$,P,P') = Nd($O_k$,P,P').

Other variations are conceivable, in which a first condition on P and P' would be tested, making the result appropriate if this first condition is verified, then a second if the first is not verified, before giving the result NORME($O_k$,P,P') = Nd($O_k$,P,P'), if the second condition itself is not also verified.

A sequence of tests using this second variation could be the following: the first test would, for example, be performed to find out if P=P': if it does, the result would be NORME($O_k$,P,P')=P; if not, a second test would be performed, for example, to find out if P=0: if it does, the result would be: NORME($O_k$,P,P')=P'; if not, the result would be:

NORME ($O_k$,P,P')=Nd($O_k$,P,P')

It is understood that these two variations are less efficient to the extent that they can lead to the creation of structures that would have been standardized if the preferred mode of embodiment had been used.

Nonetheless, these variations, which allow time to be gained, are applicable to reduced-size graphs.

The low branch P of the standardized node is defined in the following way: P=PRIME(L/\H), which means that P is itself obtained, by recursion, applying the rules currently described at the logic intersection of the low L and high H branches of the function f represented by its binary decision diagram. The low branch P is therefore composed of the implicit representation of the prime implicants of that intersection of the two high and low parts of the function.

The high branch P' of the standardized node is composed of a node defined in the following way:

P'=Nd[$S_k$, MINUS{PRIME(L),P},MINUS[PRIME(H),P)}].

Definitively,

PRIME(f)=NORME($O_k$,P,Nd[$S_k$,MINUS{ PRIME(L),P},MINUS{PRIME(H),P)}])

MINUS is an intermediate function that allows the form obtained to be simplified and allows the results obtained as a result of the application of the NORME function to be taken into account in the preceding recursions. This function will be defined later on.

Note therefore that P and P', to which the NORME function applies, require for their production, the prior construction of a diagram showing in an implicit way the prime implicants PRIME(L) of the low branch L of the function f, that of a diagram implicitly representing the prime implicants PRIME(H) of the high branch H of the function, and lastly that of a diagram showing implicitly the prime implicants PRIME(L/\H) of the logic intersection between the high and low branches of the function.

The construction of these diagrams PRIME(L), PRIME(H), PRIME(L/\H), thus requires going through the binary decision diagram of the function f recursively. Nonetheless, contrary to what was done in the prior art, this method does not require the construction of intermediate diagrams, since the elements constructed during the recursions are immediately integrated into the structure thanks to the use of the special NORME and MINUS functions. The latter will now be described.

The NORME function applies to an implicit representation structured from occurrence variables and sign variables.

The MINUS structure also applies to an implicit representation obtained initially by application of the PRIME function to the high and low branches or to a combination of the two.

Consequently, the elements on which the MINUS function works are either nodes or variables with a value of 0 or 1. When they are nodes, their root is either an occurrence variable or a sign variable.

The result of the MINUS function is an implicit representation.

This MINUS function, applied to two implicit representations, which can be called P and P', can be written MINUS(P,P') and begins with a test to find the relative values of P and P'.

If P=P', or if P=0, the result of the MINUS function applied to P and P' is MINUS(P,P')=0.

If P=1 or P'=0 or P'=1, the result of the MINUS function is MINUS(P,P')=P.

If none of the conditions verified above is met, then the nodes P and P' are broken down into their root v,v', their left or low branch L,L' and their right or high branch H,H', which can be written using the conventions defined before: Nd(v,L,H)=P and Nd(v',L',H')=P'.

A test is then performed to determine the nature and the order of the root variables v and v' of the two nodes P and P'. Indeed, the MINUS function applies different rules depending on the result found.

If the two root variables v and v' are occurrence variables, that is, if v=$O_k$ and v'=$O_{k'}$, another test is performed to determine the orders k and k'. If k is less than k', then the result of the MINUS function applied to P and P' is the following:

MINUS(P,P')=NORME($O_k$,MINUS(L),P',H)

That is to say that one standardizes a node whose root would be the variable $O_k$, which is the root of the first node P taken into account by the function MINUS; the left or low branch of this node is the result of the MINUS function applied, on one hand, to the left branch L of the first node P taken into account, and, on the other hand, to the second node P'; the right or high branch is the right branch H of the first node P implied by the MINUS function. Note therefore that the MINUS function itself requires recursive calculations, since one of the resulting elements is itself obtained by the application of this same function to some intermediate elements.

If k=k', then the result of the MINUS function is the result of the NORME function applied to a node constructed as follows: the root of this node is the variable $O_k$; its left or low branch is the result of the MINUS function applied respectively to the low branches L,L' of the nodes P,P' implied by the MINUS function°, and its right or high branch is the result of a MINUS2 function applied to the high branches H,H' of the two nodes P,P' implied by the MINUS function.

This MINUS2 function will be described later on. Consequently, the result of the MINUS function can be written:

MINUS(P,P')=NORME[$O_k$,MINUS(L,L')- ,MINUS2(H,H')].

If neither of the two conditions tested above for k and k' is verified, then the result of the MINUS function applied to P and P' is obtained by applying the MINUS function to the first node P implied by the MINUS function and to the low branch L' of the second node P' implied by the MINUS function, which can be written:

MINUS(P,P')=MINUS(P,L').

If the tests on the nature of the variables v and v' reveal that v is an occurrence variable ($v=O_k$) and that v' is a sign variable ($v'=S_{k'}$), then the order of k and k' is tested.

If k is less than k', then one standardizes a node whose root is $O_k$, that is to say, the root variable of the first node P implied by the MINUS function, whose left or low branch is the result of the MINUS function applied respectively to the left or low branch L of the first node P, and to the second node P', and whose high or right branch is the high branch H of the first node P. This can be written:

MINUS(P,P')=NORME($O_k$,MINUS(L,P'),H).

If the tests reveal that k is equal to k', then one standardizes a node whose root is the variable $O_k$ of the first node P implied by the MINUS function, whose low or left branch is the low branch L of the first node P and whose high branch is the result of the MINUS2 function applied to the high branch H of the first node P and to the second node P'. This can be written:

MINUS(P,P')=NORME($O_k$,L,MINUS2(H,P')).

If the tests on the orders of k and k' are negative, then the result of the MINUS function is the first node P itself. This can be written:

MINUS(P,P')=P.

The tests on the nature of the variables v and v' can reveal that v is a sign variable ($v=S_k$) and that v' is an occurrence variable ($v'=O_{k'}$). In this case, if the test reveals that k is less than k', then the result of the MINUS function is the first node P implied by the MINUS function. This can be written:

MINUS(P,P')=P.

If k=k', then the result of the MINUS function is the MINUS2 function applied respectively to the first node P and the high or right branch H' of the second node P'. This can be written:

MINUS(P,P')=MINUS2(P,H').

If none of the conditions on k and k' is verified, then the result is obtained by applying the MINUS function to the first node P, and to the left or low branch L' of the second node P'. This can be written:

MINUS(P,P')=MINUS(P,L').

Lastly, the tests can reveal that the root variables v and v' of the two nodes P and P' implied by the function MINUS are sign variables ($v=S_k$, $v'=S_{k'}$). In this case, if the tests on the value of k and k' reveal that k is equal to k', then the result of the MINUS function is a node whose root variable is $S_k$, that is, the root of one node or another implied by the MINUS function, whose left or low branch is the result of the MINUS function applied respectively to the low branches L,L' of the two nodes P,P' implied and whose high or right branch is obtained by applying the MINUS function to the high or right branches H,H' of the two nodes P,P' implied, respectively. This can be written:

MINUS(P,P')=Nd[$S_k$,MINUS(L,L'),MINUS(H,H')].

If the condition tested previously on the identity between k and k' is not verified, then the result of the MINUS function is the first node P implied. This can be written:

MINUS(P,P')=P.

We have already seen that the MINUS function sometimes required the use of a function called MINUS2, which is applied to elements that are themselves implicit representations.

If these elements are called respectively P and P', the MINUS2 function applied to these elements can be written:

MINUS2(P,P').

This function starts with a test to compare P and P'. If it proves that P is identical to P', then the result of the MINUS2 function is the variable "0". If the equality between the two nodes P and P' implied in the MINUS2 function is not verified, these two nodes P and P', respectively, are broken down to find their root $S_k$, $S_{k'}$, their left or low branch L,L' and their high or right branch H,H'. This is written:

Nd($S_k$,L,H)=P and Nd($S_{k'}$,L,H)=P'.

The result of the MINUS2 function is then a node whose root is the root variable $S_k$ of the first node P, whose low or left branch is the result of the MINUS function applied to the low or left branches L,L' of each of the two nodes P,P' implied by that function MINUS2, and whose high or right branch is the result of the MINUS function applied to the high branches H,H' of each of the two nodes P,P' implied by the MINUS2 function. This can be written:

MINUS2(P,P')=Nd[$S_k$,MINUS(L,L'),MINUS(H,H')].

The functions MINUS and MINUS2 nonetheless make it possible to achieve extremely simplified results, since the function MINUS takes into account the nature and the order of the variables v and v' of the representations to which it is applied. The methods in the prior art did not make it possible to obtain such simplifications.

FIGS. 4 to 9 illustrate progressively the way in which the implicit representation of the prime implicants in the binary decision diagram in FIG. 1 is produced.

FIG. 10 shows how the memory of a processor could look at the end of the computing operations, assuming that a method comparable to the one described in relation to FIG. 2 is used.

Looking at the function PRIME mentioned above shows that to create the implicit representation of the prime implicants of a function, itself represented in the form of a binary decision diagram, it is necessary to make the implicit calculation of the prime implicants of each of the high and low branches of that function in a recursive manner.

The rules of simplification resulting from the NORME and MINUS functions make it possible to obtain intermediate representations that are reasonable in size.

Figure 4:
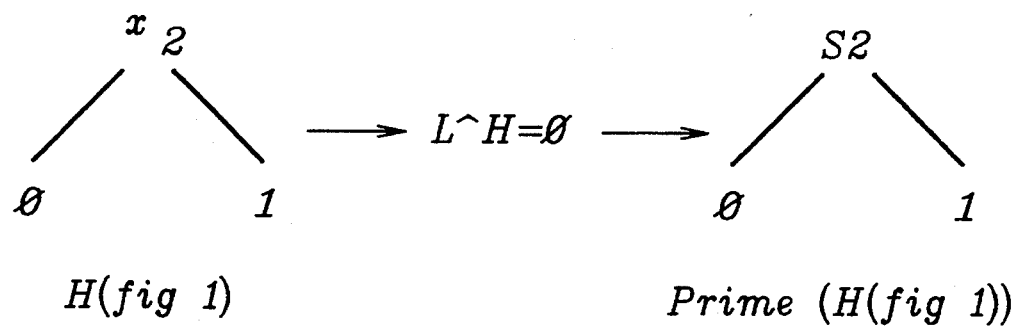
FIGS. 4 through 9 illustrate schematically various steps in creating the implicit representation of the prime implicants of the function (f) in FIG. 1.

FIG. 4 includes three drawings placed in correspondence with one another using arrows. The left part of this figure represents the high branch H which is circled in FIG. 1. This high branch is made up of a node whose root variable is $X_2$, whose low branch L is the variable 0 and whose high branch H is the variable 1. The logic intersection L/\H of the two branches gives the result 0, which we must know in order to calculate the implicit representation of the prime implicants of this branch. After application of the NORME function, we obtain definitively a node $Nd(S_2,0,1)$ which is the implicit representation of the prime implicants of the high part of the binary decision diagram in FIG. 1. This node is shown on the right in FIG. 4.

Figure 5:
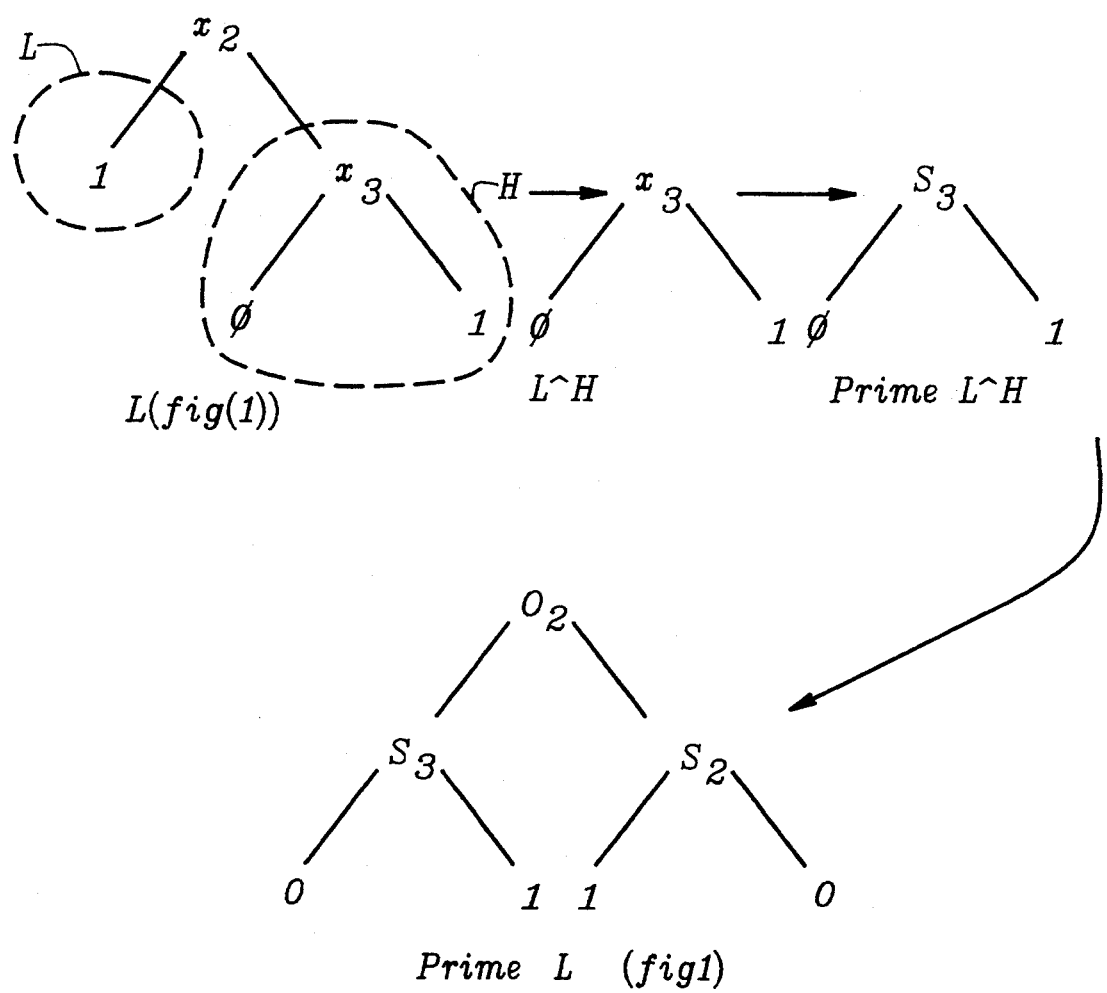

FIG. 5 shows the low part L of the binary decision diagram in FIG. 1. This low part itself includes a low part L whose value is the constant 1, and a high part H made up of a node $Nd(X_3,0,1)$. Since the low part L is composed of the constant with a value of 1, the intersection L/\H between the high part and the low part of this figure again gives the node forming the high part, that is to say that:

$$L/\backslash H = Nd(X_3,0,1).$$

Note that the structure of this node is identical, in the order of its nearest root label, to the one which represents the high branch in FIG. 1. Consequently, the implicit representation of its prime implicants is the following node:

$$PRIME(L/\backslash H) = Nd(S_3,0,1).$$

Definitively, the application of the PRIME function, which involves the NORME and MINUS functions, causes us to end up with the implicit representation of the prime implicants of the low part of the diagram in FIG. 1, composed in this way:

$$PRIME(L_{(FIG.\ 1)}) = Nd[O_2, Nd(S_3, 0,1), Nd(S_2,1,0)$$

and illustrated in the lower part of this FIG. 5.

Figure 6:
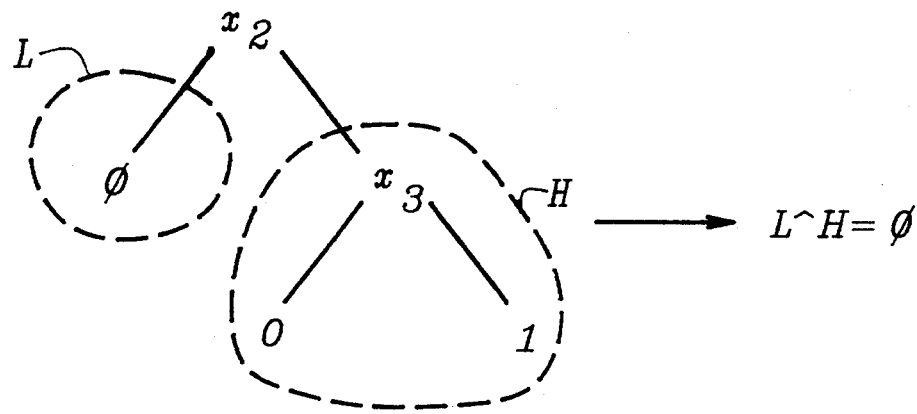

FIG. 6 shows the representative diagram of the intersection of the low L and high H branches in FIG. 1. It shows a node whose root is $X_2$, whose low branch is the constant 0 and whose high branch is a node $Nd(X_3,0,1)$. Note that the latter is identical to the high branch in FIG. 5, or to the intersection of the low and high branches of that same FIG. 5. Consequently, the processing system, in going through the memory, will determine that the calculation of the implicit representation of its prime implicants has already been done and will therefore not re-execute it.

The logic intersection of the high and low branches of the elements in FIG. 6 results in the constant 0.

Figure 7:
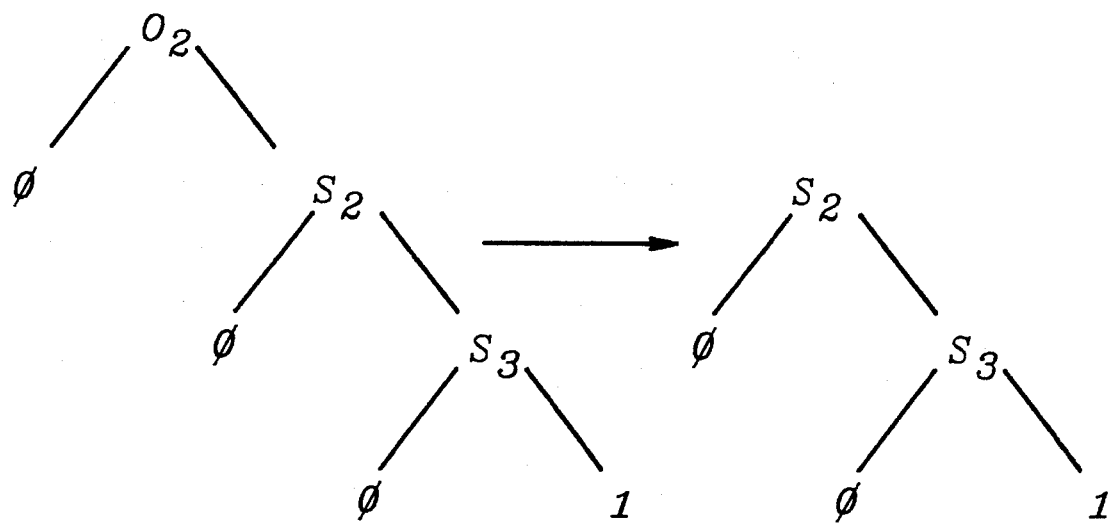

As a result, if the NORME function was not applied, the implicit representation of the prime implicants of the elements in FIG. 6 would be that which appears on the left part of FIG. 7. Because of the existence of this NORME function, the implicit representation of the prime implicants of the logic intersection of the high and low branches is the node which appears on the right part of that same FIG. 7, that is, the node:

$$Nd(S_2, 0, Nd(S_3,0,1))$$

Figure 8:
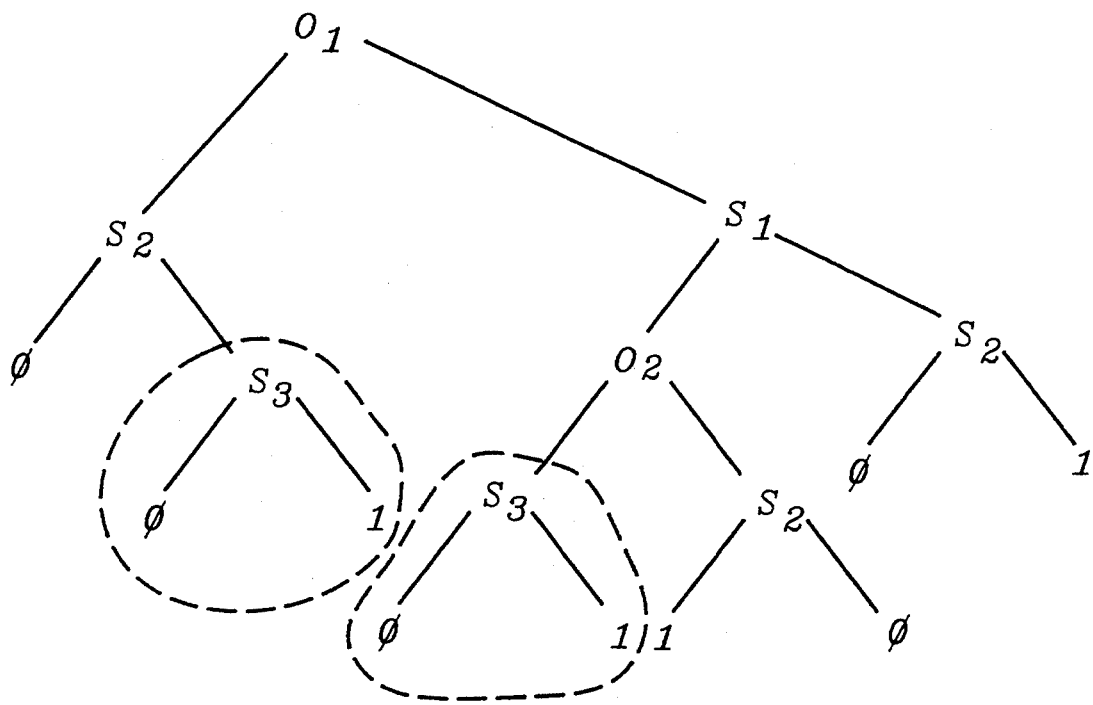

FIG. 8 illustrates an implicit intermediate representation of the prime implicants of the diagram in FIG. 1, which would be obtained if no test was performed to avoid redundancy between identical nodes plotted from different labels.

The schematic in FIG. 8 results from the application of the PRIME function to the intermediate representations appearing in FIGS. 4 to 7.

Thus, in FIG. 8, the node forming the low branch associated with the variable $S_1$ would have been determined after application of the functions MINUS and MINUS2 to certain elements of the intermediate representations.

Above all, note that this representation of FIG. 8 would twice use the node $Nd(S_3,0,1)$ which is circled in that Figure.

Indeed, one can see that this node is associated, on one hand, with a low branch connected to a label $O_2$ and to a high branch connected to a label $S_2$. That is why, instead of building this node twice, it is built only once, so that we end up with a schema that conforms to the one in FIG. 9, where the label $S_3$ is plotted by two different variables $O_2$, $S_2$.

Figure 9:
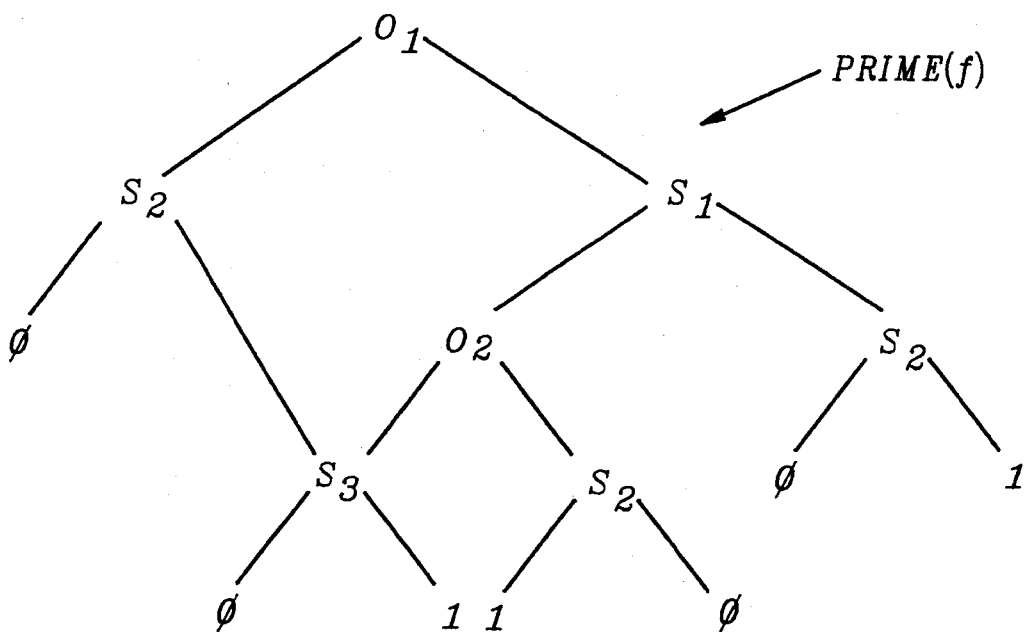

Note that the representation in FIG. 9 is comparable to the one in FIG. 1, in the sense that we have a diagram that looks like a binary decision diagram, that is, built from a root $O_1$, in this case, and having paths that end with terminal leaves whose value is 0 or 1.

By taking the different paths, starting from the root node and moving toward the leaves whose value is 1, one finds the prime implicants of the associated function.

The memory management is equipped to plot the different paths at the time when the implicants are determined.

Thus, in a specific case, one finds four different paths, thus constituting four products representing the prime implicants of the function.

The first path can read as follows: $O_1^*, S_2, S_3$, which means that the associated prime implicant is the product $X_2, X_3$, since the occurrence variable $O_1$, negative, means that $X_1$ is not part of the product. A second path is: $O_1, S_1^*, O_2^*, S_3$ which means definitively that the associated prime implicant is the product $X_1^*, X_3$.

A third path is: $O_1, S_1^*, O_2, S_2^*$, which means that the associated prime implicant is the product $X_1^*, X_2^*$. Finally, a fourth path is: $O_1, S_1, S_2$, which means that the associated prime implicant is $X_1, X_2$.

FIG. 10 illustrates how part of the memory designed to receive information on the implicit representation of the prime implicants of the function f given as an example in FIGS. 1 and 2 could be filled.

Assume that the rules for filling the memory are similar to those that were mentioned with regard to FIG. 2. Thus, each word located at an address $Ad_n$ in that memory zone can be broken down into four fields, a first field VAR receiving information on the nature and the order of the variable that it contains, a second field $IND_L$ indicating either the address or the value of the associated low branch, a third field $IND_H$ indicating the address or the value of the associated high branch, and lastly a fourth field GEST with some memory management parameters, for example.

Thus, the word located at the first $Ad_1$ in this memory zone would contain, for example the node $Nd(S_2,0,1)$ corresponding to the implicit representation of the prime implicants of the high part H of the function in FIG. 1. This node was highlighted during the description of FIG. 4. The second word, at address $Ad_2$, would contain a node $Nd(S_3,0,1)$ which is the one highlighted in FIG. 5. The third word, at the address $Af_3$, contains some information making it possible to reconstruct the node giving the implicit representation of the prime implicants of the low part of the function displayed in FIG. 1. This node, whose root is $O_2$, was highlighted with the description of FIG. 5. Its low branch is the node $Nd(S_3,0,1)$ whose representation is already in the second word, at address AD2. Consequently, the second field $IND_L$ of this third word contains information according to which the low branch is composed of the address word $Ad_2$, which prevents it from reconstructing this node, which already exists.

The upper part, which has not yet been constructed, since it is composed of a node $Nd(S_2,1,0)$, would therefore be entered in the address word $Ad_4$, and that information would be put into the field $IND_H$ of the third word, so that the system plots the address $Ad_4$.

The fifth word, at address $Ad_5$, would contain information on the implicit representation of the prime implicants prime(L\H) of the function representing the logic intersection between the high and low parts of FIG. 1.

This latter implicit representation appears in FIG. 7: it is a node whose root is the sign variable $S_2$, whose low part is the constant 0 and whose high part is a node $Nd(S_3,0,1)$. Note now that this high part has already been constructed: it is a word located at the address $Ad_2$. Consequently, in the address word $Ad_5$, the operating system would indicate that the root variable is $S_2$, that the low part is made up of the constant 0, by filling the field $IND_L$ in the appropriate way, and would indicate in the field $IND_H$ that it is necessary to plot at the address $Ad_2$ to find the node of which this high part is composed.

The sixth and seventh words located respectively at the addresses $Ad_6$ and $Ad_7$ contain information for finishing the creation of the implicit representation that appeared in FIG. 9.

The sixth word contains in its variable field the root $O_1$ of the implicit representation of the prime implicants of the function in FIG. 1. Note that the low part associated with this implicit representation is composed of elements that have already been written in the memory. This information is already contained in the fifth word which has already been completed, so that it is not necessary to repeat it. The field $IND_L$ therefore contains a return to the address $Ad_5$.

The node whose label is the root of the high part of the implicit representation has not yet been fully represented, so that it is necessary to write into the memory, at the address $Ad_7$, some information on this high part. Consequently, the field $IDN_H$ of the address word $Ad_6$ sends to the address $Ad_7$. Consequently, in the word located at this address $Ad_7$, one writes the label of the node forming this high part, namely the variable $S_1$. However, note that the low and high parts of this node have already been constructed previously: the low part is composed of the node written in the third word, at address $Ad_3$. Consequently, the field $IND_L$ of this seventh word would contain a return to this address $Ad_3$.

Note also that the high part of the node being constructed is composed of the address node $Ad_1$ already constructed.

The parameters of the management field GEST indicate, for example, whether the corresponding node is the root of the implicit representation or an intermediate node. It is understood that the contents of this field can evolve as the graph is developed, since at a given time, a node can form the root of an intermediate representation and then become an intermediate element of the construction.

It is therefore the processing system that manages these parameters, with the help of pointers, when the memory is filled.

It is understood that the representation of FIG. 10 is only a non-limiting example of the way in which the memory can be structured to give an implicit representation of the prime implicants of a function.

Thus, for example, in one variation, not shown, the management parameters, since they are capable of evolving, are entered and managed by the processing system in a specific memory zone instead of being entered in a field associated with each word.

Other variations concerning the management of the memory are within the scope of the expert.

Some tests conducted as part of the development of this invention made it possible to obtain implicit representations of prime implicants occupying memory space reduced by a factor of twenty compared to the representations obtained with the methods of the prior art. It is significant that the higher the number of variables implied in the definition of the binary decision diagram, the better the relative gains compared to the use of the methods in the prior art. This therefore highlights the real interest of the invention, since when the size of the binary decision diagrams is large, there is the greatest risk of memory saturation and methods that do not consume much memory should be used.

The tables on the following pages, in the form of an appendix, summarize the functions PRIME, NORME, MINUS, MINUS2.

Numerous modifications and variations of the present invention are possible in light of the above teachings. It is, therefore, to be understood that within the scope of the appended claims, the present invention may be practiced otherwise than as is the embodiments and implementations described hereinabove.

APPENDIX

I. Function PRIME(f)

In PRIME(f), f is a binary decision diagram and the result of this function PRIME is an implicit representation of its prime implicants.
1) If f=0, PRIME (f)=0;
2) If f=1, PRIME (f)=1; and
3) If not, $Nd(x_k,L,H)=f$ and P=PRIME (L/\H) in the following relation which determines the rule of construction for the implicit representation of the prime implicants of the function represented in its binary decision diagram (f):

PRIME(f)=NORME[$O_k$,P,Nd($S_k$,MINUS{ PRIME(L),P},MINUS{PRIME(H),P})].

II. Function NORME(x,P,P') (Preferred Embodiment)

In NORME(x,P,P'), x is a variable, P and P' are implicit representations.
1) If P=P' or P'=0, then NORME(x,P,P')=P;
2) If P=0, then NORME(x,P,P')=P'; and
3) If not, NORME(x,P,P')=Nd(x,P,P').

APPENDIX (CONT.)

III. Function MINUS(P,P')

MINUS(P,P'), in which P and P' are implicit representations, produces an implicit representation.

1) If P=P' or P=0, MINUS(P,P')=0;
2) If P=1 or P'=0 or P'=1, MINUS(P,P')=P; and
3) If not, Nd(v,L,H)=P and Nd(v',L',H')=P', then:
   A) If $v=O_k$ and $v'=O_{k'}$
      1. If k<k', then: MINUS(P,P')=NORME($O_k$,-MINUS(L,P'),H);
      2. If k=k' MINUS(P,P')=NORME($O_k$,-MINUS(L,L'),MINUS2(H,H')); and
      3. If not: MINUS(P,P')=MINUS(P,L').
   B) If $v=O_k$ and $v'=S_{k'}$
      1. If k<k', then MINUS(P,P')=NORME($O_k$, MINUS(L,P'),H) ;
      2. If k=k', then MINUS(P,P')=NORME($O_k$,L,MINUS2(H,P'));
      3. If not: MINUS(P,P')=P
   C) If $v=S_k$ and $v'=O_{k'}$
      1. If k<k', then: MINUS(P,P')=P;
      2. If k=k', then MINUS(P,P')=MINUS2(P,H'); and
      3. If not: MINUS(P,P')=MINUS(P,L').
   D) If $v=S_k$ and $v'=S_{k'}$
      1. If k=k', then: MINUS(P,P')=Nd[$S_k$,MINUS(L,L'),MINUS(H,H')]; and
      2. If not MINUS(P,P')=P .

APPENDIX (CONT.)

IV. Function MINUS2

MINUS2(P,P'), in which P and P' are implicit representations, produces an implicit representation.
1) If P=P', MINUS2(P,P')=0; and
2) If not, Nd($S_k$,L,H)=P and Nd($S_{k'}$, L', H')=P', then: MINUS2(P,P')=Nd[$S_k$,MINUS(L,L'),MINUS(H,H')].

--------------------------------

The algorithm of the function MINUS which was presented before can be presented in a simplified version.
1) If P=P' or P=0, MINUS(P,P')=0;
2) If P=1 or P'=0 or P'=1, MINUS(P,P')=P; and
3) Nd(V,L,H)=P and Nd (V',L',H')=P'
   A) If k<k'
      i) If $v=O_k$ (v is an occurrence variable) MINUS(P,P')=NORME[$O_k$,MINUS(L,P'),H];and
      ii) If not: MINUS(P,P')=P;
   B) If k>k'
      i) If $v'=O_{k'}$ (v' is an occurrence variable), MINUS(P,P')=MINUS(P,L'); and
      ii) If not, MINUS(P,P')=P.
   C) If $v=O_k$ (v is an occurrence variable)
      i) If $v'=O_{k'}$, then MINUS(P,P')=NORME[$O_k$,-MINUS(L,L'), MINUS2(H,H')]; and
      ii) If not MINUS(P,P')=NORME[$O_k$, L, MINUS2(H,P')]; and
   D) If not
      i) If $v'=O_{k'}$ MINUS(P,P')=MINUS2(P,H'); and
      ii) If not: MINUS(P,P')=Nd[$S_k$,MINUS(L,L'),MINUS(H,H')].

We claim:

1. A method, using a data-processing device, for producing a second binary decision diagram containing an implicit representation (PRIME(f)) of prime implicants of a Boolean function represented in the form of a first binary decision diagram (f) of that function, the method comprising:

producing the first binary decision diagram in a first memory zone of the data-processing device, the first binary decision diagram represented by a first memory structure containing propositional variables ($x_1, \ldots x_n$);

determining intermediate elements for the implicit representation by recursively applying intermediate element determining functions to the first binary decision diagram using the data-processing device, the intermediate elements represented by occurrence variables ($O_1, \ldots O_n$) and sign variables ($S_1, \ldots S_n$), corresponding respectively to each of the propositional variables ($x_1, \ldots x_n$) of the first binary decision diagram;

operating the data-processing device to standardize the intermediate elements when they are being determined following each recursive function application by the data-processing device;

combining repeated intermediate elements using the data-processing device after the standardization of the intermediate elements by the data-processing device to form combined, standardized intermediate elements; and storing the combined, standardized intermediate elements in a second memory zone of the data-processing device in the form of the second binary decision diagram represented by a second memory structure containing the occurrence variables ($O_1, \ldots O_n$) and the sign variables ($S_1, \ldots S_n$), wherein the second binary decision diagram contains the implicit representation (PRIME (f)) of the prime implicants of the Boolean function.

2. The method according to claim 1, wherein the step of producing the first binary decision diagram of the Boolean function includes storing a node Nd($x_k$,L,H), in which $x_k$ is a label, L is the low branch associated with this label and H is the high branch associated with this label within the first memory zone memory structure;

wherein the step of determining intermediate elements further comprises breaking down the node into its low branch L and its high branch H, obtaining a standardized implicit representation of the prime implicants of each of the node branches, and finding a binary decision diagram (L/\H) entry associated with a logic intersection of the two branches;

wherein the step of standardizing the intermediate elements further comprises obtaining a standardized implicit representation of the prime implicants of the intersection; and wherein the step of combining repeated intermediate elements further comprises combining, according to a set rule, the standardized implicit representations to obtain a result, and standardizing that result when it is produced.

3. The method according to claim 2, wherein each branch (L,H) of each node and the intersection (L/\H) formed therebetween is composed of a node combination with labels ($x_i$) ultimately ending on terminal leaves with a logic value of 0 or 1, and the method further consists of taking recursive paths across each of the nodes associated in this way in order to obtain the implicit representations of the prime implicants of those branches and their intersections.

4. The method according to claim 3, wherein the implicit representation (PRIME(f)) of the prime implicants of a first node (f) whose root is $x_k$, whose low branch is L and whose high branch is H, is constructed according to:

PRIME(f)=NORME[$O_k$,P,Nd($S_k$, MINUS{PRIME(L),P},MINUS{PRIME(H),P})], which obeys the following rules:

PRIME(0)=0; PRIME(1)=1, and in which P=PRIME(L/\H) is a second node constituting the implicit representation of the prime implicants of the logic intersection of the low L and high H branches of the node considered;

in which Nd("variable,"A,B) creates a node whose label is the "variable" element, whose low branch is element A and whose high branch is element B;

in which, NORME is a function for obtaining a standardized form of a node; and in which MINUS is a function which, applied to two standardized forms, makes it possible to achieve the implicit representation.

5. The method according to claim 4, wherein the function NORME(x,P,P'), in which x is a variable, and P and P' are two implicit representations, uses tests to compare these two implicit representations and to determine their value, then renders one or the other of the following standardized results, depending on the result of the tests:

if P=P' or P'=0, then NORME(x,P,P')=P
if P=0, then NORME(x,P,P')=P'; and
if not, NORME(x,P,P')=Nd(x,P,P').

6. The method according to claim 4, wherein the function NORME(x,P,P'), in which x is a variable and P and P' are two implicit representations, uses a first test to compare these two implicit representations and find their value, then renders one or the other of the following standardized results, depending on the result of the test:

if P=P', then NORME(x,P,P')=P; and
if not, NORME(x,P,P')=Nd(x,P,P').

7. The method according to claim 4, wherein the function NORME(x,P,P'), in which x is a variable and P and P' are two implicit representations, uses a first test to compare these two implicit representations and find their value, then renders one or the other of the following standardized results, depending on the result of the test:

if P=0, then NORME(x,P,P')=P'; and
if not, NORME(x,P,P')=Nd(x,P,P').

8. The method according to claim 4, wherein the function MINUS(P,P'), in which P and P' are implicit representations, and which produces an implicit representation, uses a second test to compare these two implicit representations and find their value, then renders one or the other of the following results, depending on the result of the test:

if P=P' or (P=0), the MINUS(P,P')=0; and
if P=1 or P'=0 or P'=1, MINUS(P,P')=P.

9. The method according to claim 8, wherein when the result of the second test highlights the fact that P is different from P' and that simultaneously P and P' are not terminal branches, that is, are two distinct nodes, the MINUS function consists of:

breaking down the node P into it roots (v), its low branch L and its high branch H;

breaking down the node P' into its root (v'), its low branch L' and its high branch H';

testing whether the roots (v,v') are occurrence variables or sign variables;

testing their order; and then, depending on the results of these last two tests, producing the following results:

A) if $v=O_k$ and $v'=O_{k'}$
1. if k<k', then: MINUS(P,P')=NORME($O_k$,MINUS(L,P'),H);
2. if k=k' MINUS(P,P')=NORME($O_k$,MINUS(L,L'),MINUS2(H,H')); and
3. if not: MINUS(P,P')=MINUS(P,L');

B) if $v=O_k$ and $v'=S_{k'}$
1. if k<k', then MINUS(P,P')=NORME($O_k$, MINUS(L,P'),H);
2. if k=k', then MINUS(P,P')=NORME($O_k$,L,MINUS2(H,P')); and
3. if not: MINUS(P,P')=P C) if $v=S_k$ and $v'=O_{k'}$
1. if k<k', then: (MINUS(P,P')=P;
2. if k=k', then MINUS(P,P')=MINUS2(P,H'); and
3. if not: MINUS(P,P')=MINUS(P,L'); and D) if $v=S_k$ and $v'=S_{k'}$
1. if k=k', then: MINUS(P,P')=Nd[$S_k$,MINUS(L,L'),MINUS(H,H')]; and
2. if not MINUS(P,P')=P.

10. The method according to claim 8, wherein when the result of the second test highlights the fact that P is different from P' and simultaneously P and P' are not terminal branches, that is, are two distinct nodes, the MINUS function consists of:

breaking the node P into its root (v), its low branch L, and its high branch H;

breaking the node P' into its root (v'), its low branch L' and its high branch H';

testing whether the roots (v,v') are occurrence variables or sign variables;

testing their order; and then, depending on the results of these last two tests, producing the following results:

A) if k<k'
i) if $v=O_k$ (v is an occurrence variable) MINUS(P,P')=NORME[$O_k$,MINUS(L,P'),H]; and
ii) If not: MINUS(P,P')=P B) if k>k'
i) if $v'=O_{k'}$ (v' is an occurrence variable), MINUS (P,P')=MINUS(P,L'); and
ii) If not, MINUS(P,P')=P;

C) if $v=O_k$ (v is an occurrence variable)
i) if $v'=O_{k'}$ (v' is an occurrence variable), then MINUS(P,P')=NORME[$O_k$, MINUS(L,L'), MINUS2(H,H')]; and
ii) if not MINUS(P,P')=NORME[$O_k$, L, MINUS2(H,P')]; and D) if not
i) if $v'=O_{k'}$ MINUS(P,P')=MINUS2(P,H'); and
ii) if not: MINUS(P,P')=Nd[$S_k$,MINUS(L,L'),MINUS(H,H')]

11. The method according to one of claims 9 or 10, wherein the function MINUS2(P,P'), in which P and P' are implicit representations, which produces an implicit representation, highlights a last test to compare these two implicit representations, then, depending on the result of the test:

if P=P', then MINUS2(P,P')=0;
if not, the node P is broken down into its root ($S_k$), its low branch L, its high branch H; the node P' is broken down into its root ($S_{k'}$), its low branch L' and it high branch H'; and $Nd(S_k,L,H)=P$ and $Nd(S_{k'},L',H')=P'$, then: $MINUS2(P,P')=Nd[S_k,MINUS(L,L'),MINUS(H,H')]$.

12. The method according to claim 1, wherein the processing system is arranged to test, following the determination of the parameters of a new node, whether that node already exists in memory and, if it does, entering in the memory data for reusing this node that has already been constructed.

13. A system for producing a second binary decision diagram containing an implicit representation (PRIME(f)) of prime implicants of a Boolean function, the Boolean function initially represented in the form of a first binary decision diagram (f) of that function, the system comprising:

a data-processing device including a first memory zone and a second memory zone;

a binary decision diagram generator within the data-processing device for producing the first binary decision diagram in the first memory zone, the first decision diagram represented by a memory structure containing propositional variables $(x_1, \ldots x_n)$;

a first processor within the data-processing device for determining intermediate elements from the first binary decision diagram, the processor recursively applying intermediate element determining functions to the first binary decision diagram, the intermediate elements represented by occurrence variables $(O_1, \ldots O_n)$ and sign variables $(S_1, \ldots S_n)$, corresponding respectively to each of the propositional variables $(x_1, \ldots x_n)$ of the first binary decision diagram;

a second processor within the data-processing device for standardizing the intermediate elements when they are being determined following each recursive function application by the first processor, thus forming standardized intermediate elements;

a memory manager for controlling combination of repeated, standardized intermediate elements using the data-processing device after the standardization of the intermediate elements by the second processor, thus forming combined, standardized intermediate elements; and a memory allocation device for storing the combined, standardized intermediate elements in a second memory zone of the data-processing device in the form of the second binary decision diagram, represented by a second memory structure containing the occurrence variables $(O_1, \ldots O_n)$ and the sign variables $(S_1, \ldots S_n)$, wherein the second binary decision diagram contains the implicit representation (PRIME (8)) of the prime implicants of the Boolean function.

* * * * *

UNITED STATES PATENT AND TRADEMARK OFFICE
CERTIFICATE OF CORRECTION

PATENT NO. : 5,434,794
DATED : July 18, 1995
INVENTOR(S) : Olivier Coudert, et al.

It is certified that error appears in the above-indentified patent and that said Letters Patent is hereby corrected as shown below:

```
Column 9, line 30, the line of the equation which reads
"MINUS{PRIME(L),P},MINUS[PRIME(H),P)}]" should read
--MINUS{PRIME(L),P},MINUS{PRIME(H),P)}]--.

Column 15, line 20, "prime (L\H)" should read
--prime (L/ \H)--.
```

Signed and Sealed this

Twenty-second Day of October, 1996

Attest:

BRUCE LEHMAN

*Attesting Officer*    *Commissioner of Patents and Trademarks*